(12) United States Patent
Kobayashi

(10) Patent No.: US 8,072,033 B2
(45) Date of Patent: Dec. 6, 2011

(54) SEMICONDUCTOR DEVICE HAVING ELONGATED ELECTROSTATIC PROTECTION ELEMENT ALONG LONG SIDE OF SEMICONDUCTOR CHIP

(75) Inventor: Nobuyuki Kobayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/068,188

(22) Filed: Feb. 4, 2008

(65) Prior Publication Data

US 2008/0203435 A1 Aug. 28, 2008

(30) Foreign Application Priority Data

Feb. 27, 2007 (JP) ................. 2007-046382

(51) Int. Cl.
*H01L 29/76* (2006.01)
(52) U.S. Cl. .................. 257/373; 257/E27.03
(58) Field of Classification Search .................. 257/361, 257/373–376, 546–547, E31.084, E27.03, 257/E27.032, E27.063; 361/56; 438/200
See application file for complete search history.

(56) References Cited

U.S. PATENT DOCUMENTS

| | | | | |
|---|---|---|---|---|
| 5,406,513 A * | 4/1995 | Canaris et al. | ................. | 365/181 |
| 5,491,358 A * | 2/1996 | Miyata | ................. | 257/546 |
| 5,828,110 A * | 10/1998 | Wollesen | ................. | 257/373 |
| 7,294,542 B2 * | 11/2007 | Okushima | ................. | 438/199 |
| 2002/0084490 A1 * | 7/2002 | Ker et al. | ................. | 257/355 |
| 2004/0188841 A1 * | 9/2004 | Chen et al. | ................. | 257/758 |
| 2005/0067657 A1 * | 3/2005 | Tanaka | ................. | 257/355 |
| 2006/0081935 A1 * | 4/2006 | Morishita | ................. | 257/361 |
| 2006/0151783 A1 * | 7/2006 | Otani | ................. | 257/48 |
| 2006/0181823 A1 * | 8/2006 | Miller et al. | ................. | 361/56 |
| 2007/0001886 A1 | 1/2007 | Ito et al. | | |
| 2007/0002509 A1 * | 1/2007 | Kumagai et al. | ................. | 361/56 |
| 2007/0045768 A1 * | 3/2007 | Yamanka et al. | ................. | 257/506 |

FOREIGN PATENT DOCUMENTS

| | | |
|---|---|---|
| JP | 2005-72607 | 3/2005 |
| JP | 2005-252214 | 9/2005 |
| JP | 2007-43035 | 2/2007 |
| KR | 10-2007-0003630 | 1/2007 |

OTHER PUBLICATIONS

Korean Office Action dated May 31, 2010.

* cited by examiner

*Primary Examiner* — Matthew W Such
*Assistant Examiner* — Ali Naraghi
(74) *Attorney, Agent, or Firm* — McGinn IP Law Group, PLLC

(57) ABSTRACT

An electrostatic protection element is disposed commonly to a plurality of output circuits along a long side of an output circuit region. More preferably, the electrostatic protection element should be disposed between a Pch region and an Nch region of an output circuit.

15 Claims, 7 Drawing Sheets

US 8,072,033 B2

SEMICONDUCTOR DEVICE HAVING ELONGATED ELECTROSTATIC PROTECTION ELEMENT ALONG LONG SIDE OF SEMICONDUCTOR CHIP

BACKGROUND OF THE INVENTION

1. Field of the Invention

The present invention relates to a semiconductor device, and more particularly to a layout of an electrostatic protection element.

2. Description of Related Art

A driver IC for driving a display panel is required to be protected from electrostatic discharge. To realize such protection from electrostatic discharge, for example, Japanese Patent Application Laid-Open Publication No. 2005-252214 discloses a technique for providing an electrostatic protection element in such a driver IC.

Japanese Patent Application Laid-Open Publication No. 2005-072607 also discloses a layout of an electrostatic protection element to be employed for a semiconductor device. The semiconductor device described in this document disposes an electrostatic protection element for each input-output pad.

In the case of the layout configuration described in the JP-A No. 2005-072607, however, the electrostatic protection element area increases if an electrostatic protection element is provided for each input-output pad, for example, in a PDP (plasma display panel) driver IC that includes many input-output pads. As a result, the chip size also increases and the semiconductor device cost increases.

In each of those PDP driver ICs, therefore, a GND-VDD (ground potential-power source Vdd potential) protection element common to a plurality of input-output pads is disposed in the protection element regions 101 at both sides of the subject chip respectively as shown in a layout in FIG. 1. Here, a circuit cell disposed in each output pad shown in FIG. 1 and used for controlling output signals is an output circuit and the output circuit is configured by, for example, a circuit element according to the Push-Pull method. Hereunder, there will be described an output circuit disposed region as an output circuit unit.

FIG. 2 shows a circuit corresponding to the layout shown in FIG. 1. In FIG. 2, each output circuit of the output circuit unit 100 shown in FIG. 1 is substituted for a basic inverter. Rn and Rp are line resistors disposed between each of GND and VDD of the output circuits and a protection element. A protection diode D1 is formed in a protection element region 101.

In order to improve the resistance to electrostatic discharge, it is important to avoid concentration of the electrostatic discharge current at a specific element.

FIG. 3A shows an example of a current path formed when electrostatic discharge is applied to an output terminal OUT with reference to the GND.

As shown clearly in FIG. 3A, there are resistors Rn and Rp disposed on lines from the output circuits GND and VDD to the anode and cathode of the protection element D1. The current path 1 does not go through the electrostatic protection element D1, so that the electrostatic discharge current flow is concentrated at the Nch transistor N1 of an output circuit. The current path 2 is provided to reduce the electrostatic discharge load applied to the Nch transistor N1 through the current path 1 by distributing the load. A Pch transistor P1 is provided on this current path 2.

In order to improve the resistance to electrostatic discharge, it is important to reduce the values of the line resistors Rn and Rp shown in FIG. 3A. Large values of the line resistors Rn and Rp reduce the current flow to the current path 2, thereby lowering the effect of the current path 2 including the electrostatic protection element D1.

FIG. 3B shows an example of a current path formed when electrostatic discharge is applied to the output terminal OUT with reference to the VDD. Similarly to FIG. 3A, it is also important to reduce the values of the line resistors Rn and Rp in FIG. 3B.

In case where an electrostatic protection element D1 is disposed at both sides of a driver IC as shown in FIGS. 1 and 2 according to the conventional technique, the line resistance is not equalized between the output circuit of each input-output pad and the electrostatic protection element D1. For example, particularly in an output circuit having a large resistance value in a line up to the electrostatic protection element D1, it is impossible to obtain an electrostatic discharge effect for the electrostatic protection element D1. This is why a large resistance value appears in the current path 2 of the center output pad in the subject layout, which is farthest from any of the electrostatic protection elements D1, thereby an electrostatic discharge current is concentrated at the current path 1 and the resistance to electrostatic discharge is minimized. This has been a problem.

SUMMARY OF THE INVENTION

A semiconductor device includes a plurality of output circuits and each of those output circuits includes an output circuit unit having a long side and a short side and shaped almost like a rectangle, and an electrostatic protection element having a long side almost equal in length to the long side of the output circuit unit and shaped almost as a rectangle.

According to the present invention, it is possible to equalize and minimize the line length between an electrostatic protection element and an output circuit, thereby the parasitic resistance value of the line between the output circuit and the electrostatic protection element can be fixed and minimized regardless of the output circuit in the subject layout. Therefore, it is also possible to eliminate the difference of the resistance to electrostatic discharge among output circuits, which has depended on the position of the output circuit in the layout; thereby the total resistance to electrostatic discharge in the semiconductor device is improved without increasing the layout area.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
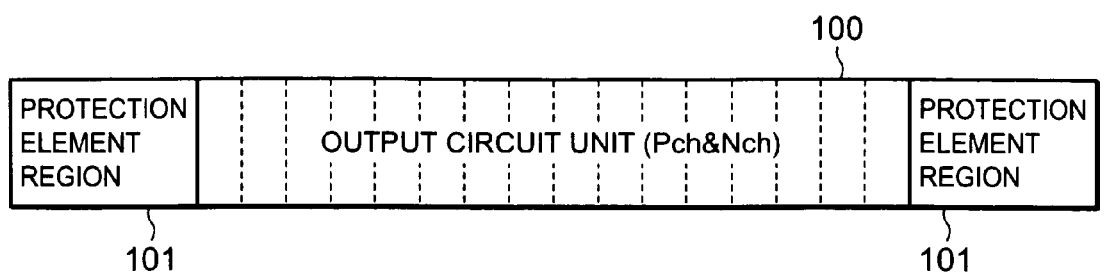
FIG. 1 is a schematic layout of a semiconductor device of a related art.
Figure 2:
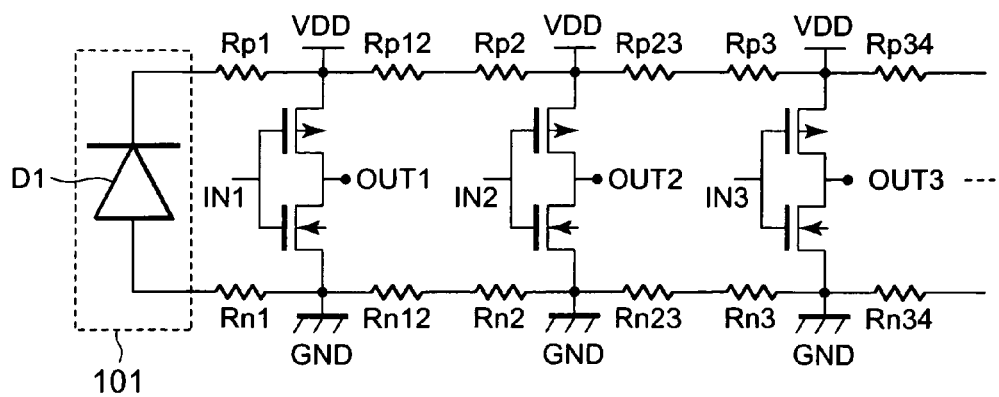
FIG. 2 is a circuit diagram corresponding to the schematic layout shown in FIG. 1.
Figure 3A:
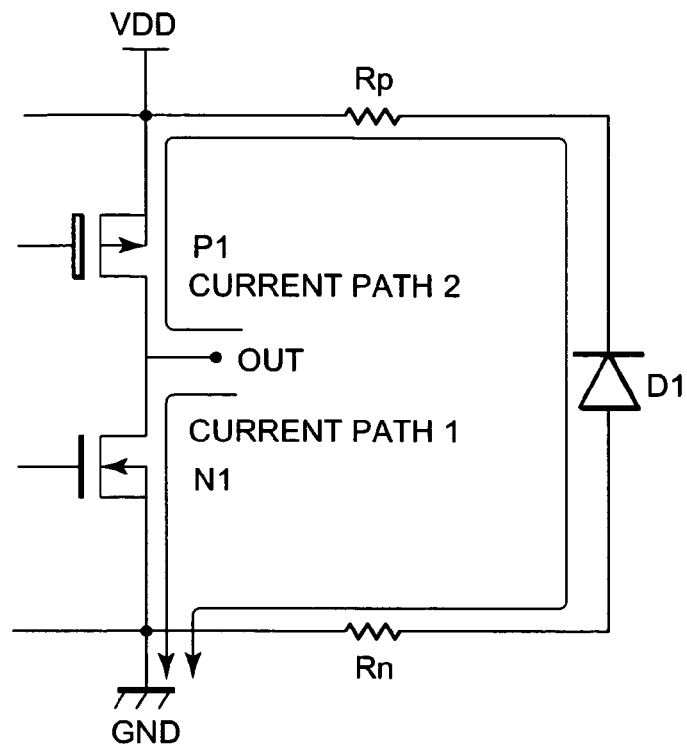
FIG. 3A is a diagram for showing a current path formed when electrostatic discharge is applied to an output terminal OUT.
Figure 3B:
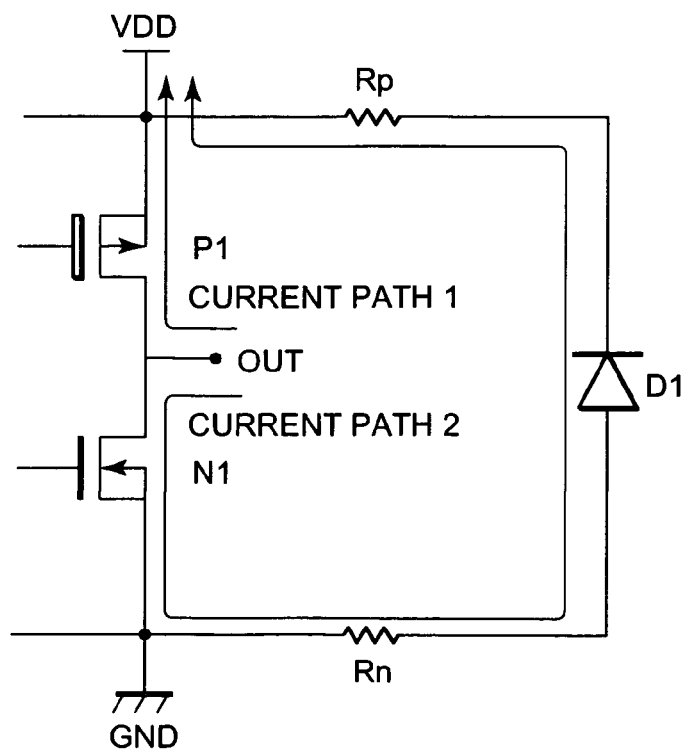
FIG. 3B is another diagram for showing a current path formed when electrostatic discharge is applied to the output terminal OUT.
Figure 4:
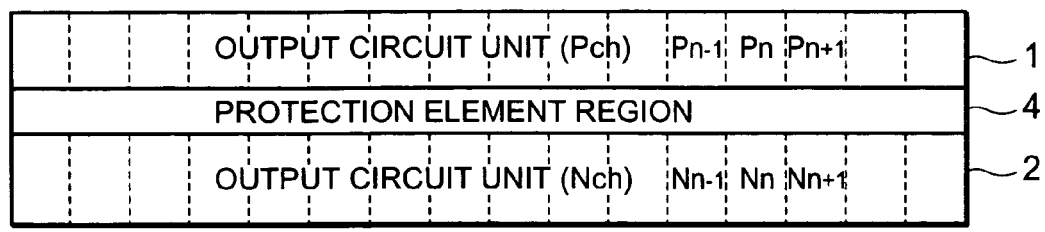
FIG. 4 is a schematic layout of a semiconductor device in a first embodiment of the present invention.
Figure 5:
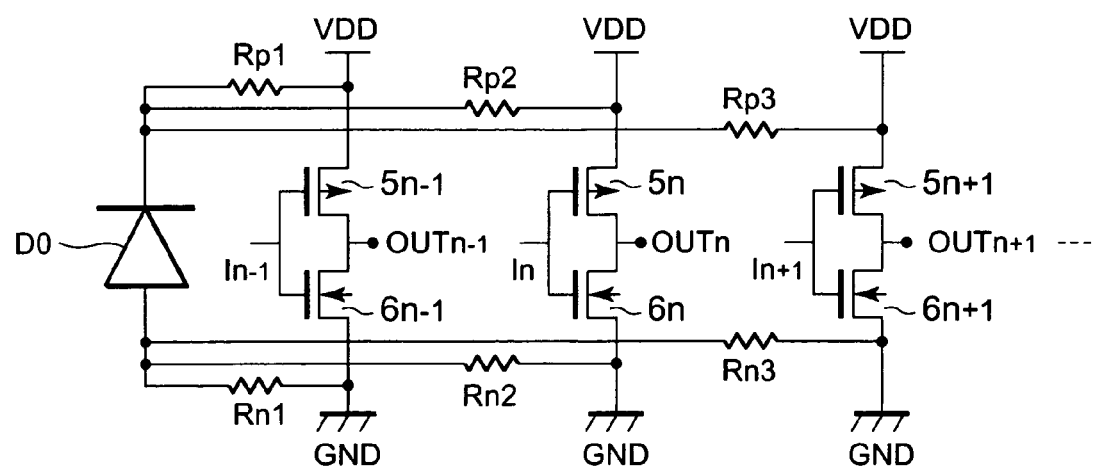
FIG. 5 is a circuit diagram corresponding to the schematic layout shown in FIG. 4.

FIG. 4 shows a schematic layout of a semiconductor device of the present invention and FIG. 5 shows an equalizing circuit of the semiconductor device shown in FIG. 4.

As shown in FIG. 4, a protection element region 4 is provided between a Pch output circuit 1 and an Nch output circuit 2 in an output circuit unit. The total layout area occupied by the Pch output circuit 1, the Nch output circuit 2, and the protection element 4 is almost substantially equal to that shown in the conventional example in which a protection element region is provided at both sides. Each of the output circuits 1 and 2 is shaped almost substantially as a rectangle having long and short sides respectively. The protection element region 4 is disposed along the long side of each of the output circuits 1 and 2.

As shown in FIG. 5, a diode is formed in each protection element region 4 and functions, for example, as an electrostatic protection element D0. The cathode of the diode is connected to, for example, a first power supply potential line VDD near each output circuit and the anode is connected to a second power supply potential line GND that functions, for example, as a ground potential line near each output circuit. An output circuit Pch transistor 5 is formed in the Pch output circuit 1 and an output circuit Nch transistor 6 is formed in the Nch output circuit 2. Pch transistors 5n−1, 5n, 5n+1 are formed in the regions Pn−1, Pn, and Pn+1 of the Pch output circuit 1 respectively. Nch transistors 6n−1, 6n, and 6n+1 are formed in the regions Nn−1, nn, and Nn+1 of the Nch output circuit 2 respectively. Consequently, each output circuit In includes transistors Pn and Nn. In this embodiment, each output circuit is an inverter circuit. However, the output circuit may also be, for example, an output circuit according to the Push-Pull method.

Line resistors Rn and Rp are parasitic resistors of a line between each of power supply lines GND and VDD near each output circuit and the protection element D0. The protection element D0 is wired so as to be connected commonly to each output circuit. As shown clearly in FIG. 4, the line for connecting the protection element D0 to the power supply line VDD or GND near each output circuit is minimized in length and equalized. Consequently, the values of the line resistors Rp and Rn can be minimized and equalized regardless of the layout of the output circuit.

Figure 6:
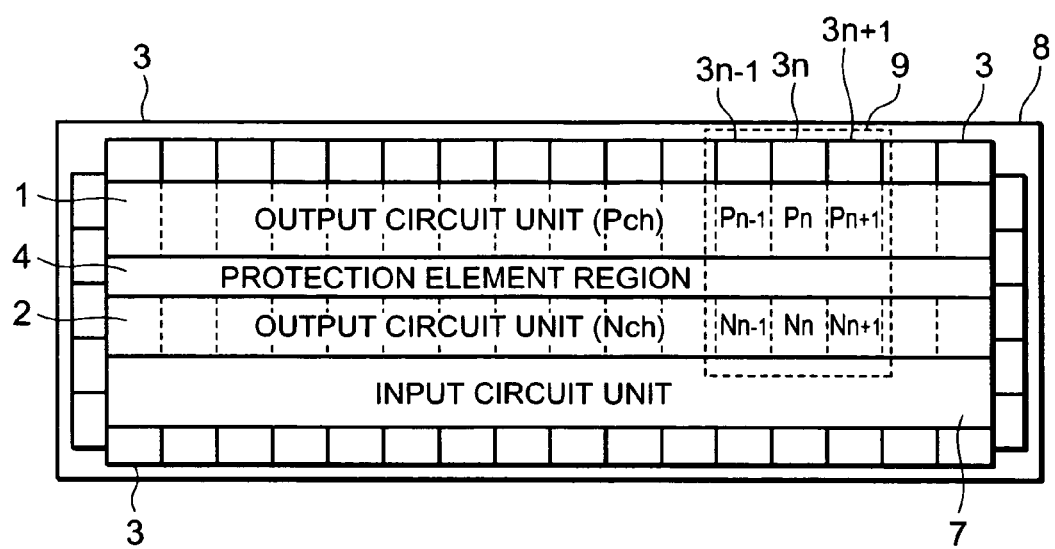
FIG. 6 is a detailed layout of the semiconductor device in the first embodiment.

FIG. 6 shows an overall schematic view of the semiconductor device 8 that includes the output circuit unit and the protection elements in the first embodiment. The semiconductor device 8 is, for example, a one-chip PDP driver.

Figure 7A:
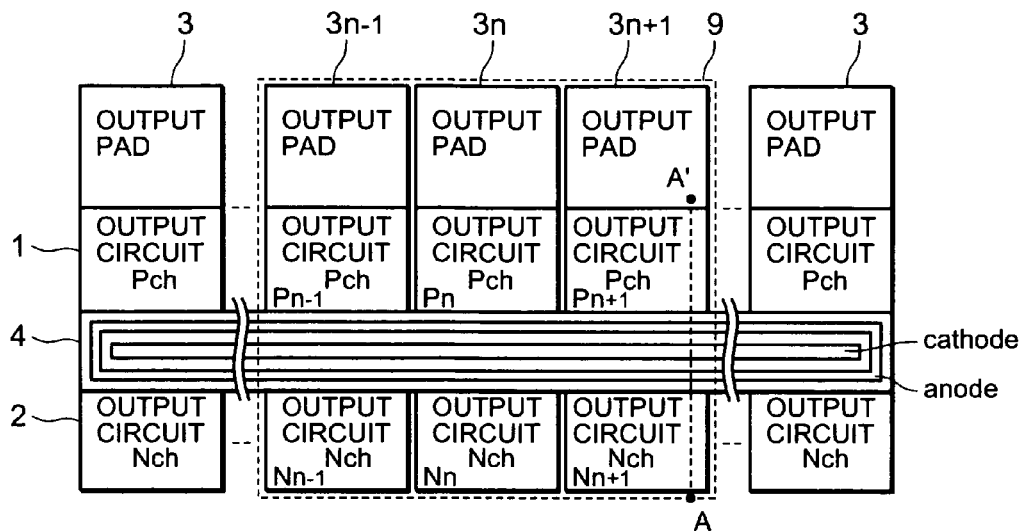
FIG. 7A is an expanded view of the schematic layout shown in FIG. 6.
Figure 7B:
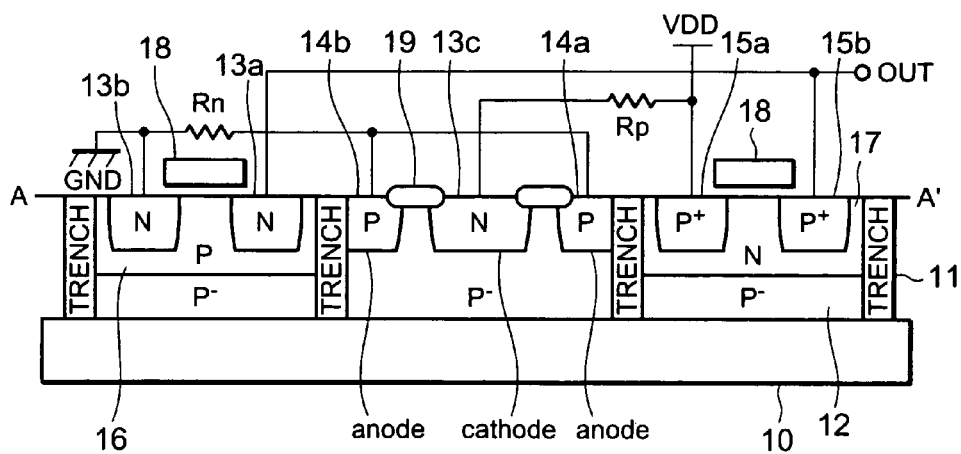
FIG. 7B is a cross-sectional view taken on line A-A' of FIG. 7A.

An input-output pad 3 for electrically connecting an external device is provided near each side of the semiconductor device 8. An input circuit unit 7 executes a predetermined processing for a signal received from external through a predetermined input pad 3. Each of the output circuits 1 and 2 receives a signal processed as predetermined and outputs the processed signal to a predetermined output pad 3. FIG. 7A shows detailed views of the output pad 3, the output circuits 1 and 2, and the protection element 4 shown in FIG. 6. A region 9 shown in FIG. 7A corresponds to the region 9 shown in FIG. 6. FIG. 7B shows a cross-sectional view taken on line A-A' of FIG. 7A.

As shown in FIG. 7B, a plurality of P-type semiconductor wells 12 are provided on an SOI (Semiconductor On insulator) substrate 10 and those wells are isolated from each other by a trench 11. P-type semiconductor region 16 is formed on a semiconductor well 12 on which an Nch transistor is to be formed. N-type diffusion regions 13a and 13b are formed on the semiconductor region 16. A gate oxide film (not shown) is formed on the semiconductor region 16 between the diffusion regions 13a and 13b and a gate electrode 18 is formed thereon.

On a semiconductor well 12 on which a Pch transistor is to be formed is formed an N-type semiconductor region 17. On the semiconductor region 17 are formed P+ type diffusion regions 15a and 15b and a gate electrode 18 is formed thereon.

In the protection element region 4, an N-type diffusion region 13c and P-type diffusion regions 14a and 14b are formed on a semiconductor well 12 formed on the SOI substrate 10. The diffusion regions 14a and 14b become anodes of the diode D0 and the diffusion region 13 becomes a cathode of the diode D0. An insulating film 19 is formed between the diffusion region 13 and each of the diffusion regions 14a and 14b.

The diffusion region 13b (Nch transistor source terminal) formed in the Nch output circuit 2 is connected to the GND power supply while the diffusion region 15a (Pch transistor source terminal) formed in the Pch output circuit 1 is connected to the VDD power supply. The diffusion region 13a (Nch MOS transistor drain terminal) formed in the Nch output circuit 2 and the diffusion region 15b (Pch transistor drain terminal) formed in the Pch output circuit 1 are connected to the output terminal OUT respectively.

The diffusion regions 14a and 14b used as anodes of the diode D0 formed in a protection element 4 are connected to the GND through the line parasitic resistor Rn. The diffusion region 13 used as a cathode of the diode D0 formed in a protection element region 4 is connected to the VDD through a line parasitic resistor Pn.

As shown in FIG. 7A, the diffusion layers 14a and 14b used as anodes of the protection element D0 are formed so as to go through a plurality of output circuits. In FIG. 7A, those diffusion layers 14a and 14b are formed as a common region ranged from the output circuit units 1 and 2 closest to one of the short sides of the semiconductor device 8 to the output circuit units 1 and 2 closest to the other short side thereof. The diffusion layer 13 used as a cathode is also formed similarly. The diffusion regions 13a to 13c can be formed in the same process. The diffusion regions 14a, 14b, 15a, and 15b can also be formed in the same process.

According to this first embodiment of the present invention, because an electrostatic protection element region is provided in an output circuit unit, the resistance of the line to the electrostatic protection element is equalized at a small value among all the output circuits.

Particularly, in case where a protection element region is provided between the Pch region and the Nch region in each output circuit as shown in FIG. 7A, the line resistance can be reduced effectively. In other words, a protection element requires wiring of both VDD and GND lines and as shown in FIG. 7B, the VDD line is used in the Pch region while the GND line is used in the Nch region.

According to this first embodiment, because a protection element region 4 is provided between a Pch region and an Nch region, both VDD and GND lines can be drawn easily to the protection element. Consequently, the electrostatic discharge effect of the electrostatic protection element is obtained sufficiently in every output circuit. Thereby the resistance to electrostatic protection in the whole circuit unit is improved. Furthermore, according to this first embodiment of the present invention, the resistance of the line to the electrostatic protection element is equalized at a small value among the output circuits, thereby the electrostatic discharge effect of the electrostatic protection element is obtained sufficiently in every output circuit and the resistance to electrostatic protection of the whole circuit unit is improved.

Figure 8A:
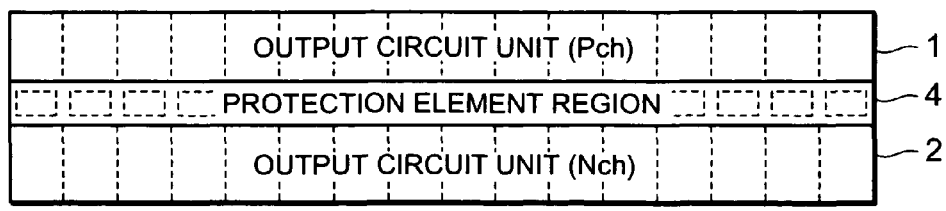
FIG. 8A is a schematic layout of a semiconductor device in a second embodiment of the present invention.
Figure 8B:
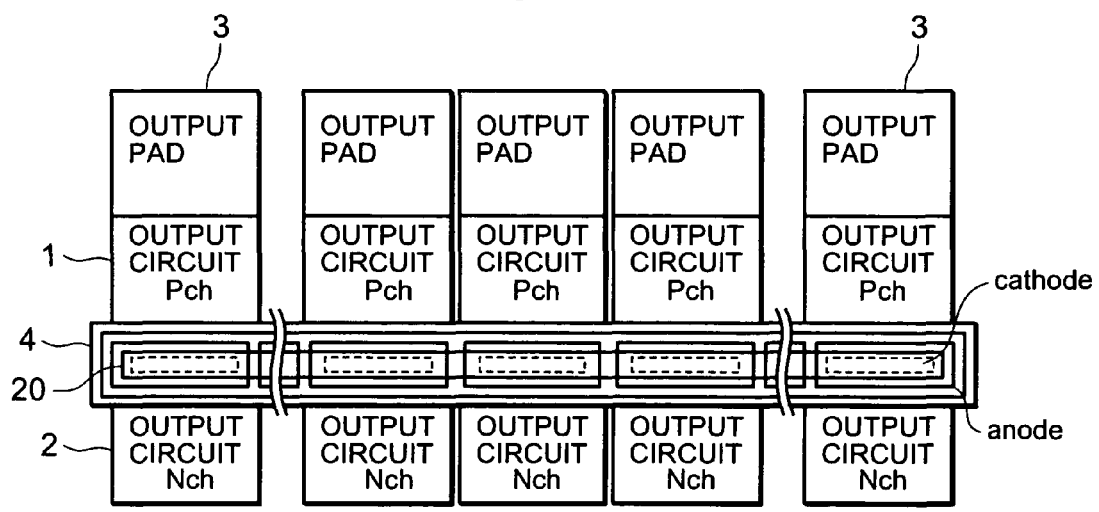
FIG. 8B is a detailed layout of the semiconductor device shown in FIG. 8A.

FIGS. 8A-8B show diagrams for describing a second embodiment of the present invention. FIG. 8A shows a schematic diagram for showing output circuit units 1 and 2, as well as a protection element region 4 in this second embodiment and FIG. 8B shows a detailed diagram of FIG. 8A.

A diffusion layer 13 that functions as a cathode shown in FIG. 7A is formed so as to be shared by a plurality of output circuits as described above. A diffusion layer 13 that functions as a cathode in FIGS. 8A and 8B is formed for each output circuit. In other words, the insulating film 19 provided between the anode and the cathode in FIG. 7A is formed like a line between an output circuit on one short side of the semiconductor device 8 and an output circuit on the other short side thereof. However, the insulating film provided between the anode and the cathode shown in FIGS. 8A and 8B is formed as a ring for each output circuit and a cathode is formed inside the ring-like insulating film while an anode is formed outside the ring-like insulating film. Because each cathode is connected to a power supply independently, a common electrode 20 is formed on an interlayer insulating film (not shown) and it is connected to each cathode diffusion layer 13 through a contact hole (not shown).

According to this second embodiment of the present invention, therefore, it is possible to extend the peripheral length of the boundary between a cathode and an anode by arranging a plurality of small electrostatic protection elements side by side, thereby obtaining an electrostatic discharge effect more than any electrostatic protection element having the same area. Consequently, according to the layout of the semiconductor device in this second embodiment, even when the electrostatic protection element in the first embodiment is employed and the element area is the same, the resistance to electrostatic discharge becomes higher in this second embodiment. In this second embodiment, a ring-like insulating film is formed between the anode and the cathode in each output circuit. However, such a ring-like insulation film may be formed for each group of some output circuits.

Figure 9:
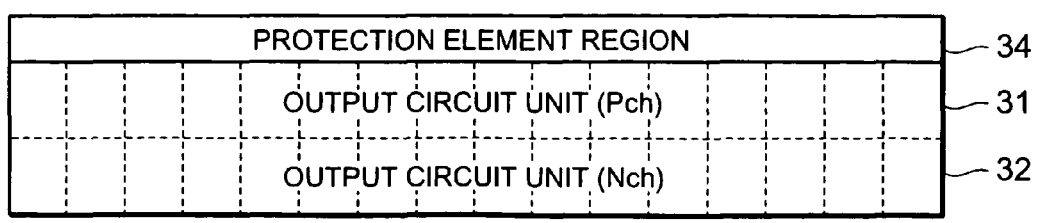
FIG. 9 is a schematic layout of a semiconductor device in a third embodiment of the present invention.

FIG. 9 shows a diagram for describing a semiconductor device in a third embodiment of the present invention. As shown in FIG. 9, output circuit units 31 and 32 are provided adjacently to each other. A protection element region 34 is formed at the side of the outside disposed output circuit unit 31 of those output circuits 31 and 32. The protection element region 34 is disposed along the long side of each of the output circuit units 31 and 32. This protection element region 34 may also be disposed at the side of the output circuit unit 32. Needless to say, although the layout of the semiconductor device in this third embodiment is slightly larger than the semiconductor device in the first and second embodiments, even this configuration can improve the resistance to electrostatic discharge more than any of the above described conventional techniques.

Figure 10:
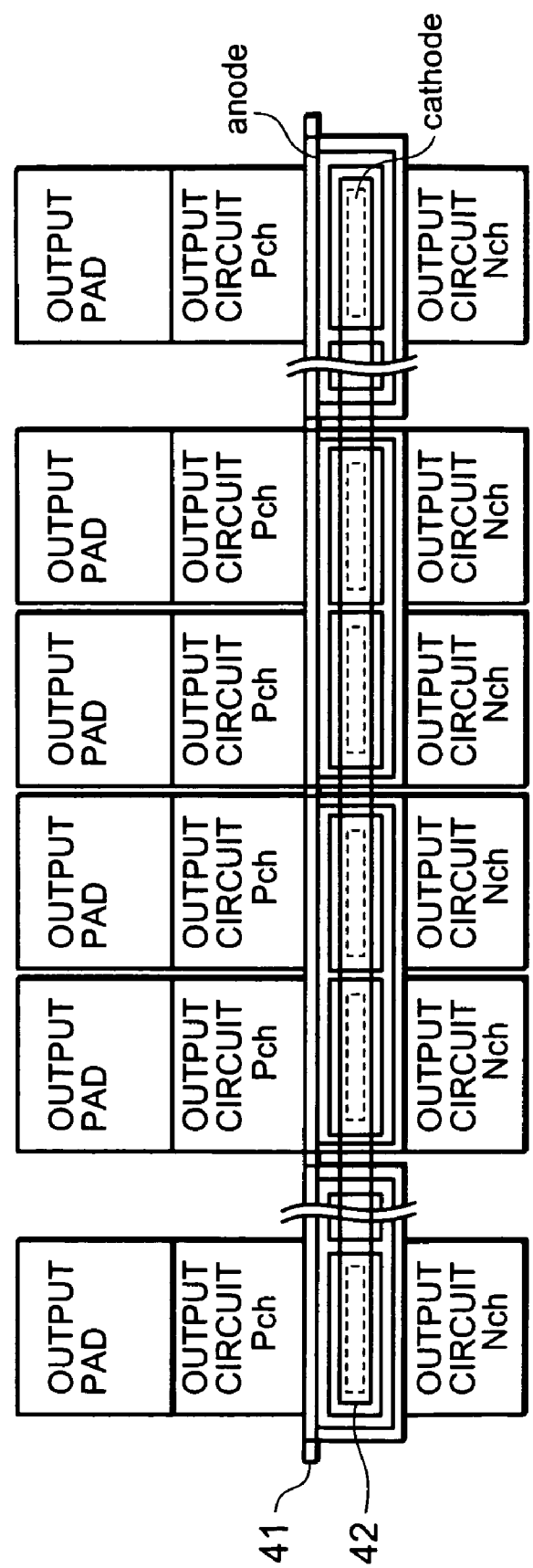
FIG. 10 is a schematic layout of a semiconductor device in a fourth embodiment of the present invention.

FIG. 10 shows a diagram for describing a semiconductor device in a fourth embodiment of the present invention. In FIG. 8B, a cathode is divided. In this fourth embodiment, however, an anode is divided. In FIG. 10, a diffusion region that functions as an anode is provided for each output circuit. However, a plurality of output circuits may be collected into one diffusion region or may be formed independently of the output circuits. In this case, the number of diffusion regions (anodes) is less than the number of output circuits (output terminals), that is, the number of outputs. Cathodes are connected to each another through a common line 41 while anodes are connected to each another through a common line 42.

The present invention is not limited only to the above embodiments. It is to be understood that modifications will be apparent to those skilled in the art without departing from the spirit of the invention.

Further, it is noted that, Applicant's intent is to encompass equivalents of all claim elements, even if amended later during prosecution

What is claimed is:
1. A semiconductor device, comprising:
an output circuit region shaped approximately as a rectangle having a long side and a short side; and
an electrostatic protection element region which is formed along said long side of said output circuit region and which has a substantially rectangular shape having a long side approximately equal in length to said long side of said output circuit region,
wherein said electrostatic protection element region includes:
a single first diffusion region of a first conductivity type which mostly extends from one end to an other end of said long side in said electrostatic protection element;
a second diffusion region of a second conductivity type formed on the single first diffusion region and which acts as a cathode; and
a third diffusion region of the first conductive type formed on the single first diffusion region and which acts as an anode,
wherein said first, second, and third diffusion regions forming a single diode structure approximately equal in length to said long side of said output region,
wherein said output circuit region comprises a plurality of output circuits,
wherein each of said plurality of output circuits includes a first channel type transistor formed in a first region and a second channel type transistor formed in a second region, and
wherein said electrostatic protection element region is formed between said first region and said second region.
2. The semiconductor device according to claim 1, wherein the first diffusion region includes a single second diffusion region which mostly extends from one end to the other end of said long side in said electrostatic protection region.
3. The semiconductor device according to claim 1, wherein the first diffusion region includes a plurality of second diffusion regions, partitioned by a ring-like insulating film, for every of each of a corresponding one of said output circuits.
4. The semiconductor device according to claim 3, wherein said plurality of second diffusion regions are connected to each other through a wire, to form as one electrostatic protection element.
5. The semiconductor device according to claim 3, wherein a number of said second diffusion regions is less than a number of outputs of the semiconductor device.
6. The semiconductor device according to claim 1, wherein the first diffusion region includes a plurality of second diffusion regions, partitioned by a ring-like insulating film, for every part of said plurality of output circuits.

7. The semiconductor device according to claim 1,
wherein said electrostatic protection element region is provided with an inter-power electrostatic protection element which is formed commonly to said plurality of output circuits.

8. The semiconductor device of claim 1, wherein each said plurality of output circuits comprise a first transistor type connected to a first power supply voltage and a second transistor type connected to a second power supply voltage,
wherein respective connections between each said plurality of output circuits and said first and second power supply voltages are equalized in length so that values of a line resistance between said first and second power supply voltages for each said output circuit are substantially equal.

9. A semiconductor device, comprising:
an output circuit region shaped approximately as a rectangle having a long side and a short side; and
an electrostatic protection element region which is formed along said long side of said output circuit region and which has a substantially rectangular shape having a long side approximately equal in length to said long side of said output circuit region,
wherein said output circuit region comprises a plurality of output circuits,
wherein said electrostatic protection element region includes:
 a single first diffusion region of a first conductivity type which mostly extends from one end to an other end of said long side in said electrostatic protection element;
 a plurality of second diffusion regions of the first conductivity type formed on the single first diffusion region, which acts as an anode, and extending from one end to an other end of said long side so as to be less than a number of said output circuits; and
 a plurality of third diffusion regions of a second conductive type formed on the single first diffusion region, which acts as a cathode, and provided more than a number of said second diffusion regions,
wherein said plurality of second diffusion regions are connected to each other through a first wire and said plurality of third diffusion regions are connected to each other through a second wire,
wherein said first, second, and third diffusion regions form a single diode structure approximately equal in length to said long side of said output region,
wherein said output circuit region comprises a plurality of output circuits,
wherein each of said plurality of output circuits includes a first channel type transistor formed in a first region and a second channel type transistor formed in a second region, and
wherein said electrostatic protection element region is formed between said first region and said second region.

10. The semiconductor device of claim 9, wherein each said plurality of output circuits comprise a first transistor type connected to a first power supply voltage and a second transistor type connected to a second power supply voltage,
wherein respective connections between each said plurality of output circuits and said first and second power supply voltages are equalized in length so that values of a line resistance between said first and second power supply voltages for each said output circuit are substantially equal.

11. A semiconductor device, comprising:
an input circuit region shaped approximately as a rectangle having a long side and a short side, said long side being arranged along an edge of a long side of a semiconductor chip and placed adjacent to said edge of said long side of said semiconductor chip;
an output circuit region shaped approximately as a rectangle having a long side and a short side, said output circuit being placed adjacent to an other edge of said long side of said semiconductor chip, said output circuit region including a first portion where a first channel type transistor is formed, and a second portion where a second channel type transistor is formed, each of said first and second portions having a length substantially equal to that of said long side of said output circuit region;
an electrostatic protection element region which is formed in said output circuit region and has a length substantially equal to that of said long side of said output circuit region; and
a pad region arranged at a periphery region of said semiconductor chip to surround said input and output circuit regions,
wherein said electrostatic protection element region includes:
 a single first diffusion region of a first conductivity type which extends from one end to an other end of said long side in said electrostatic protection element region;
 a second diffusion region of a second conductivity type formed on the single first diffusion region and which acts as a cathode; and
 a third diffusion region of the first conductivity type formed on the single first diffusion region and which acts as an anode,
wherein said first, second, and third diffusion regions form a single diode structure approximately equal in length to said long side of said output region,
wherein said output circuit region comprises a plurality of output circuits,
wherein each of said plurality of output circuits includes a first channel type transistor formed in a first region and a second channel type transistor formed in a second region, and
wherein said electrostatic protection element region is formed between said first region and said second region.

12. The semiconductor device as claimed in claim 11, wherein said electrostatic protection element region is formed between said first and second portions.

13. The semiconductor device according to claim 11, wherein the first diffusion region includes a single second diffusion region which mostly extends from one end to the other end of said long side in said electrostatic protection region.

14. The semiconductor device according to claim 11, wherein the first diffusion region includes a plurality of second diffusion regions, partitioned by a ring-like insulating film.

15. The semiconductor device of claim 11, wherein said output circuit region comprises a plurality of output circuit regions, each said plurality of output circuit regions comprising said first transistor type connected to a first power supply voltage and said second transistor type connected to a second power supply voltage,
wherein respective connections between each said plurality of output circuits and said first and second power supply voltages are equalized in length so that values of a line resistance between said first and second power supply voltages for each said output circuit region are substantially equal.

* * * * *